US012763657B2

(12) United States Patent
Yamamoto

(10) Patent No.: US 12,763,657 B2
(45) Date of Patent: Oct. 13, 2026

(54) SEMICONDUCTOR CIRCUIT DEVICE AND SWITCHING REGULATOR INCLUDING A LEVEL-SHIFTER COUPLED TO A DIFFERENTIAL AMPLIFIER

(71) Applicant: SEIKO EPSON CORPORATION, Tokyo (JP)

(72) Inventor: Yuki Yamamoto, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 187 days.

(21) Appl. No.: 18/782,579

(22) Filed: Jul. 24, 2024

(65) Prior Publication Data

US 2025/0038662 A1 Jan. 30, 2025

(30) Foreign Application Priority Data

Jul. 26, 2023 (JP) ................................ 2023-121450

(51) Int. Cl.
*H02M 1/00* (2006.01)
*H02M 3/156* (2006.01)
(Continued)

(52) U.S. Cl.
CPC ....... *H02M 1/0025* (2021.05); *H02M 1/0009* (2021.05); *H02M 3/156* (2013.01);
(Continued)

(58) Field of Classification Search
CPC .... H02M 3/156; H02M 3/158; H02M 3/1588; H02M 1/0009; H02M 1/0025; H02M 1/0003; H03F 1/3211; H03F 3/45179; H03F 3/45192; H03F 2203/45344; H03F 2203/45668; H03F 2203/45182
See application file for complete search history.

(56) References Cited

U.S. PATENT DOCUMENTS 6,388,521 B1 * 5/2002 Henry ................ H03F 3/45766 327/307
2007/0170904 A1 7/2007 Hojo
(Continued)

FOREIGN PATENT DOCUMENTS

WO 2005/078910 A1 8/2005

OTHER PUBLICATIONS

R. Sheehan, "Understanding and applying current-mode control theory," TI SNVA555, Texas Instruments, 2007 (Year: 2007).*

*Primary Examiner* — Monica Lewis
*Assistant Examiner* — Jye-June Lee
(74) *Attorney, Agent, or Firm* — Rankin, Hill & Clark LLP

(57) ABSTRACT

A semiconductor circuit device includes a current detecting circuit that converts an inductor current into a voltage and outputs the voltage as a current detection voltage, a differential amplifier circuit that amplifies a difference between a voltage corresponding to the output voltage and a reference voltage, a level shifter, and a comparing circuit that compares the current detection voltage with a level-shifted voltage and outputs a switching signal for a switching device. The differential amplifier circuit includes a MOS transistor provided between a power supply node and an output node. The level shifter level-shifts a voltage at the output node of the differential amplifier circuit to a low potential side and outputs the level-shifted voltage.

14 Claims, 12 Drawing Sheets

(51) Int. Cl.
*H03F 1/32* (2006.01)
*H03F 3/45* (2006.01)

(52) U.S. Cl.
CPC ....... *H03F 1/3211* (2013.01); *H03F 3/45179* (2013.01); *H03F 2203/45344* (2013.01); *H03F 2203/45668* (2013.01)

(56) References Cited

U.S. PATENT DOCUMENTS

| | | | | |
|---|---|---|---|---|
| 2009/0128116 A1* | 5/2009 | Noda | H02M 3/1588 | 323/290 |
| 2015/0357914 A1* | 12/2015 | Ozanoglu | H02M 3/158 | 323/271 |
| 2023/0152869 A1* | 5/2023 | Duval | H02M 3/155 | 713/300 |

* cited by examiner

FC $$Gc(s) = Gm \times R0 \times \frac{\left(1 + \frac{s}{\omega zc1}\right)}{\left(1 + \frac{s}{\omega pc1}\right) \times \left(1 + \frac{1}{\omega pc2}\right)}$$

↑ INCREASE (R0)

SEMICONDUCTOR CIRCUIT DEVICE AND SWITCHING REGULATOR INCLUDING A LEVEL-SHIFTER COUPLED TO A DIFFERENTIAL AMPLIFIER

The present application is based on, and claims priority from JP Application Serial Number 2023-121450, filed Jul. 26, 2023, the disclosure of which is hereby incorporated by reference herein in its entirety.

BACKGROUND

1. Technical Field

The present disclosure relates to a semiconductor circuit device, a switching regulator, and the like.

2. Related Art

WO2005/078910 discloses a switching power supply device including a P-type transistor, an N-type transistor, a driver, a differential amplifier, a level shifter, a comparator, and an RS flip-flop. A voltage obtained by dividing a voltage appearing at a coupling node between a coil and a capacitor by resistance, and a reference voltage are input to the differential amplifier. The level shifter level-shifts a voltage from the differential amplifier to a power supply potential side. The comparator compares a voltage from the level shifter with a voltage representing a current flowing through the coil. The RS flip-flop and the driver control the P-type transistor and the N-type transistor based on output from the comparator, and the P-type transistor and the N-type transistor drive the coil.

When an output voltage of a differential amplifier circuit is low, the characteristics of the differential amplifier circuit may degrade, and the characteristics of a switching regulator may not be characteristics as designed. For example, when a load of the switching regulator is low or when a power supply is turned on, the output voltage of the differential amplifier circuit may decrease, and the characteristics of the differential amplifier circuit may degrade. In the above-mentioned WO2005/078910, the level shifter level-shifts the output voltage of the differential amplifier to a higher voltage. Therefore, the output voltage of the differential amplifier is lower than that when the level shifter is not provided, and there is a high possibility that the characteristics of the differential amplifier circuit may degrade.

SUMMARY

An aspect of the present disclosure relates to a semiconductor circuit device that is used for a switching regulator that regulates an input voltage using a switching device and an inductor and outputs an output voltage. The semiconductor device includes a current detecting circuit that converts an inductor current flowing through the inductor into a voltage and outputs the voltage as a current detection voltage, a differential amplifier circuit that includes a MOS transistor provided between a power supply node and an output node and amplifies a difference between a voltage corresponding to the output voltage and a reference voltage, a level shifter that level-shifts a voltage at the output node of the differential amplifier circuit to a low potential side and outputs the level-shifted voltage, and a comparing circuit that compares the current detection voltage with the level-shifted voltage and outputs a switching signal for the switching device.

Another aspect of the present disclosure relates to a switching regulator including the above-described semiconductor circuit device and the inductor.

DESCRIPTION OF EMBODIMENTS

Hereinafter, preferred embodiments of the present disclosure will be described in detail. The present embodiment described below does not unduly limit the contents described in the appended claims, and all of configurations described in the present embodiment are not necessarily essential configuration requirements. For example, although a step-down switching regulator will be described below as an example, a method according to the present embodiment can also be used for a step-up switching regulator.

1. Switching Regulator and Semiconductor Circuit Device

Figure 1:
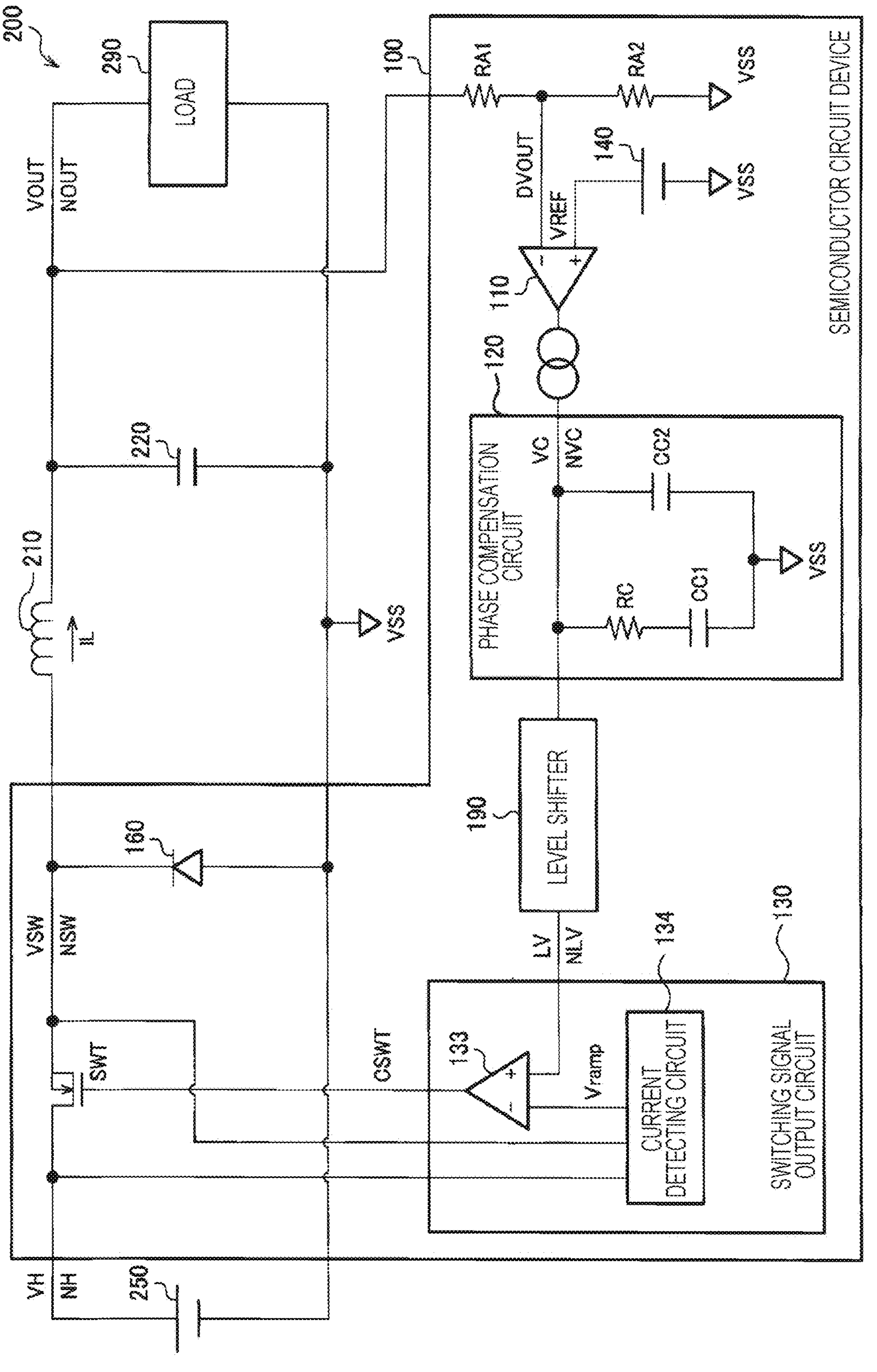
FIG. 1 illustrates an example of a configuration of a switching regulator.

FIG. 1 illustrates an example of a configuration of a switching regulator. The switching regulator 200 includes a semiconductor circuit device 100, an inductor 210, and a capacitor 220.

A power supply 250 is coupled between a low-potential-side power supply node to which a low-potential-side power supply VSS is supplied and an input node NH of the switching regulator 200. The power supply 250 generates an input voltage VH to be applied to the switching regulator 200. The power supply 250 may be either an AC/DC converter or a DC/DC converter. In the present embodiment, coupling includes electrical coupling. The electrical coupling is coupling in which an electrical signal, a voltage, or a current can be transmitted, and includes coupling in which information can be transmitted by an electrical signal. The electrical coupling may be coupling via a passive element, an active element, or the like.

One end of the inductor 210 is coupled to a switching node NSW, and the other end of the inductor 210 is coupled to an output node NOUT of the switching regulator 200. One end of the capacitor 220 is coupled to the node NOUT, and the other end of the capacitor 220 is coupled to the low-potential-side power supply node. A current IL flowing through the inductor 210 is referred to as an inductor current.

A load 290 of the switching regulator 200 is provided between the output node NOUT and the low-potential-side power supply node. The load 290 is a circuit that uses an output voltage VOUT of the switching regulator 200 as a power supply voltage.

The semiconductor circuit device 100 controls the switching regulator 200 such that the output voltage VOUT of the switching regulator 200 becomes a predetermined voltage. The semiconductor circuit device 100 is an integrated circuit device in which a plurality of circuit elements are integrated on a semiconductor substrate. The semiconductor circuit device 100 includes a switching device SWT, a diode 160, a resistor RA1, a resistor RA2, a reference voltage generating circuit 140, a differential amplifier circuit 110, a phase compensation circuit 120, a level shifter 190, and a switching signal output circuit 130. The switching device SWT, the diode 160, the resistor RA1, the resistor RA2, and the reference voltage generating circuit 140 may be provided outside the semiconductor circuit device 100.

The switching device SWT is a transistor and is controlled to be turned on or off by a switching signal CSWT. Although FIG. 1 illustrates an example in which the switching device SWT is an N-type transistor, the switching device SWT may be a P-type transistor. The source of the switching device SWT is coupled to the switching node NSW, and the drain of the switching device SWT is coupled to the input node NH. The switching signal CSWT is input to the gate of the switching device SWT.

The anode of the diode 160 is coupled to the low-potential-side power supply node, and the cathode of the diode 160 is coupled to the switching node NSW. A switching device may be provided instead of the diode 160. The switching device is off when the switching device SWT is on. The switching device is on when the switching device SWT is off.

One end of the resistor RA1 is coupled to the output node NOUT, and the other end of the resistor RA1 is coupled to an inverting input terminal of the differential amplifier circuit 110. One end of the resistor RA2 is coupled to the inverting input terminal of the differential amplifier circuit 110, and the other end of the resistor RA2 is coupled to the low-potential-side power supply node. The resistors RA1 and RA2 divide the output voltage VOUT into a voltage DVOUT.

The reference voltage generating circuit 140 is coupled between a non-inverting input terminal of the differential amplifier circuit 110 and the low-potential-side power supply node. The reference voltage generating circuit 140 generates a reference voltage VREF for setting the voltage value of the output voltage VOUT. The semiconductor circuit device 100 performs feedback control to control the output voltage VOUT such that the voltage DVOUT becomes equal to the reference voltage VREF.

The differential amplifier circuit 110 converts the difference between the voltage DVOUT and the reference voltage VREF into a current, converts the current into a voltage VC by output impedance of the differential amplifier circuit 110, and outputs the voltage VC to an output node NVC. The differential amplifier circuit 110 is also referred to as a transconductance amplifier, a Gm amplifier, or an error amplifier.

The phase compensation circuit 120 is a circuit that performs phase compensation of a feedback loop. The phase compensation circuit 120 includes a resistor RC, a first capacitor CC1, and a second capacitor CC2.

The resistor RC and the first capacitor CC1 are coupled in series between the output node NVC of the differential amplifier circuit 110 and the low-potential-side power supply node. One end of the resistor RC is coupled to the output node NVC, and the other end of the resistor RC is coupled to one end of the first capacitor CC1. The other end of the first capacitor CC1 is coupled to the low-potential-side power supply node. One end of the second capacitor CC2 is coupled to the output node NVC, and the other end of the second capacitor CC2 is coupled to the low-potential-side power supply node.

The switching regulator 200 is divided into a compensator and a plant. The compensator includes the resistor RA1, the resistor RA2, the differential amplifier circuit 110, and the phase compensation circuit 120. The plant includes the switching device SWT, the switching signal output circuit 130, the inductor 210, the diode 160, the capacitor 220, and the load 290. When the output impedance of the differential amplifier circuit 110 is RO, the compensator has a zero point at a frequency $\omega zc1=1/(RC\times CC1)$, a first pole at a frequency $\omega pc1=1/(RO\times CC1)$, and a second pole at a frequency $\omega pc2=1/(RC\times CC2)$. The resistance value of the resistor RC and the capacitance value of the first capacitor CC1 are set such that the zero point of the compensator is substantially the same as a pole of the plant. As a result, the pole of the plant and the zero point of the compensator cancel each other, and a transfer function of the switching regulator 200 as a whole has the first pole at the frequency ωpc1 and the second pole at the frequency ωpc2. The frequencies of these poles are controlled by the compensator. Therefore, the bandwidth, the phase margin, and the like of the switching regulator 200 can be controlled by determining a circuit constant of the compensator.

The level shifter 190 is provided between the output node NVC of the differential amplifier circuit 110 and a node NLV. The level shifter 190 level-shifts the voltage VC output from the differential amplifier circuit 110 to a low potential side and outputs the result of the level-shifting to the node NLV as a level-shifted voltage LV. As will be described later with reference to FIGS. 2 and 3, the level shifter 190 is, for example, a source follower circuit. The level shifter 190 may be any circuit as long as the level shifter 190 can shift the voltage to a low potential side. An amount by which the voltage is shifted is, for example, about a threshold voltage of a transistor, but is not limited thereto, and may be a shift amount sufficiently less than the power supply voltage. The shift amount may be equal to or greater than an overdrive voltage when transistors included in an output stage of the differential amplifier circuit 110 operate in a saturated state.

The switching signal output circuit 130 controls, based on the voltage LV output by the level shifter 190 and the inductor current IL, the switching device SWT such that the switching device SWT is turned on or off. The switching signal output circuit 130 includes a current detecting circuit 134 and a comparing circuit 133.

The current detecting circuit 134 outputs a voltage Vramp based on the inductor current IL. Specifically, the inductor current IL is converted into a voltage by the on-resistance of the switching device SWT. The switching signal output circuit 130 generates the voltage Vramp based on the difference in potential between both ends of the switching device SWT. Hereinafter, the voltage Vramp is also referred to as a current detection voltage.

The comparing circuit 133 compares the voltage LV from the level shifter 190 with the current detection voltage Vramp from the current detecting circuit 134. The comparing circuit 133 controls a pulse width of the switching signal CSWT, which is a PWM signal, by the voltage comparison. PWM is an abbreviation for Pulse Width Modulation.

The current detection voltage Vramp may be generated based on, for example, the difference in potential between both ends of a sense resistor coupled in series to the inductor 210. The switching signal output circuit 130 may perform not only the PWM control but also PFM control, for example. That is, the switching signal output circuit 130 may control a pulse frequency of the switching signal CSWT, which is a PFM signal, based on the voltage LV and the inductor current IL. PFM is an abbreviation for Pulse Frequency Modulation.

Figure 2:
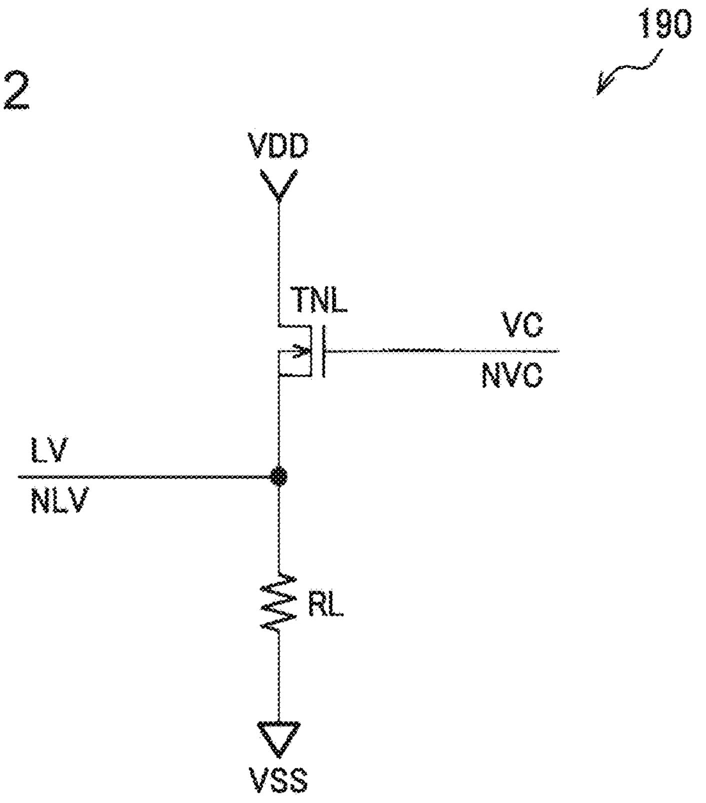
FIG. 2 illustrates a first example of a detailed configuration of a level shifter.

FIG. 2 illustrates a first example of a detailed configuration of the level shifter. The level shifter 190 is a source follower circuit and includes an N-type MOS transistor TNL and a resistor RL.

The drain of the N-type MOS transistor TNL is coupled to a node at an internal power supply voltage VDD, and the source of the N-type MOS transistor TNL is coupled to the node NLV. The internal power supply voltage VDD is generated by a regulator 170 described later with reference to FIG. 9. The gate of the N-type MOS transistor TNL is coupled to the output node NVC of the differential amplifier circuit 110. That is, the voltage VC is input to the gate of the N-type MOS transistor TNL. One end of the resistor RL is coupled to the node NLV, and the other end of the resistor RL is coupled to the low-potential-side power supply node.

Figure 3:
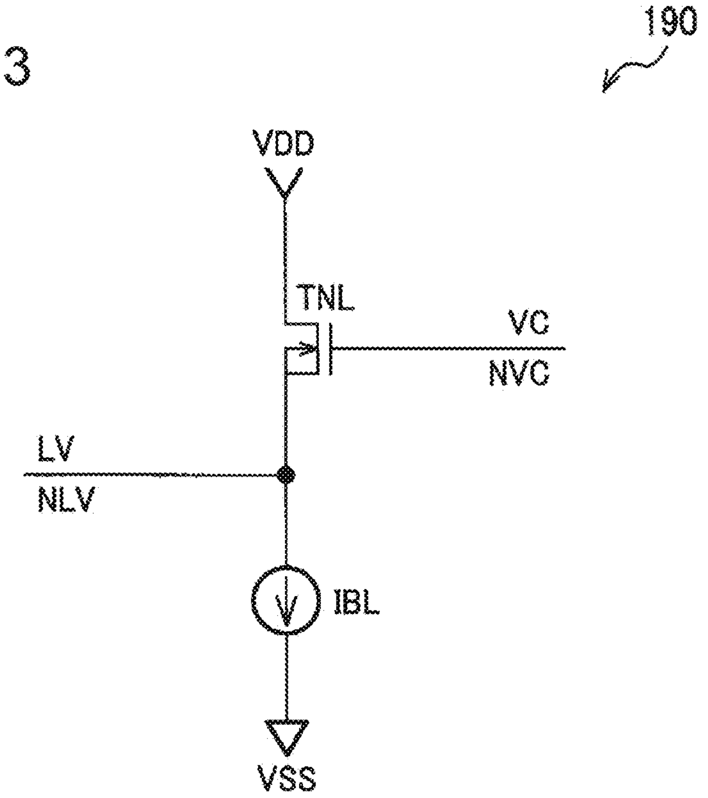
FIG. 3 illustrates a second example of the detailed configuration of the level shifter.

FIG. 3 illustrates a second example of the detailed configuration of the level shifter. The level shifter 190 is a source follower circuit and includes an N-type MOS transistor TNL and a current source IBL. Components different from the components illustrated in FIG. 2 will be described.

One end of the current source IBL is coupled to the node NLV, and the other end of the current source IBL is coupled to the low-potential-side power supply node. The current source IBL causes a bias current to flow in a direction from the node NLV to the low-potential-side power supply node.

In the examples illustrated in FIGS. 2 and 3, the level shifter 190 level-shifts the voltage VC output by the differential amplifier circuit 110 to a low potential side by the threshold voltage of the N-type MOS transistor TNL and outputs the result of the -shifting as the level-shifted voltage LV.

Figure 4:
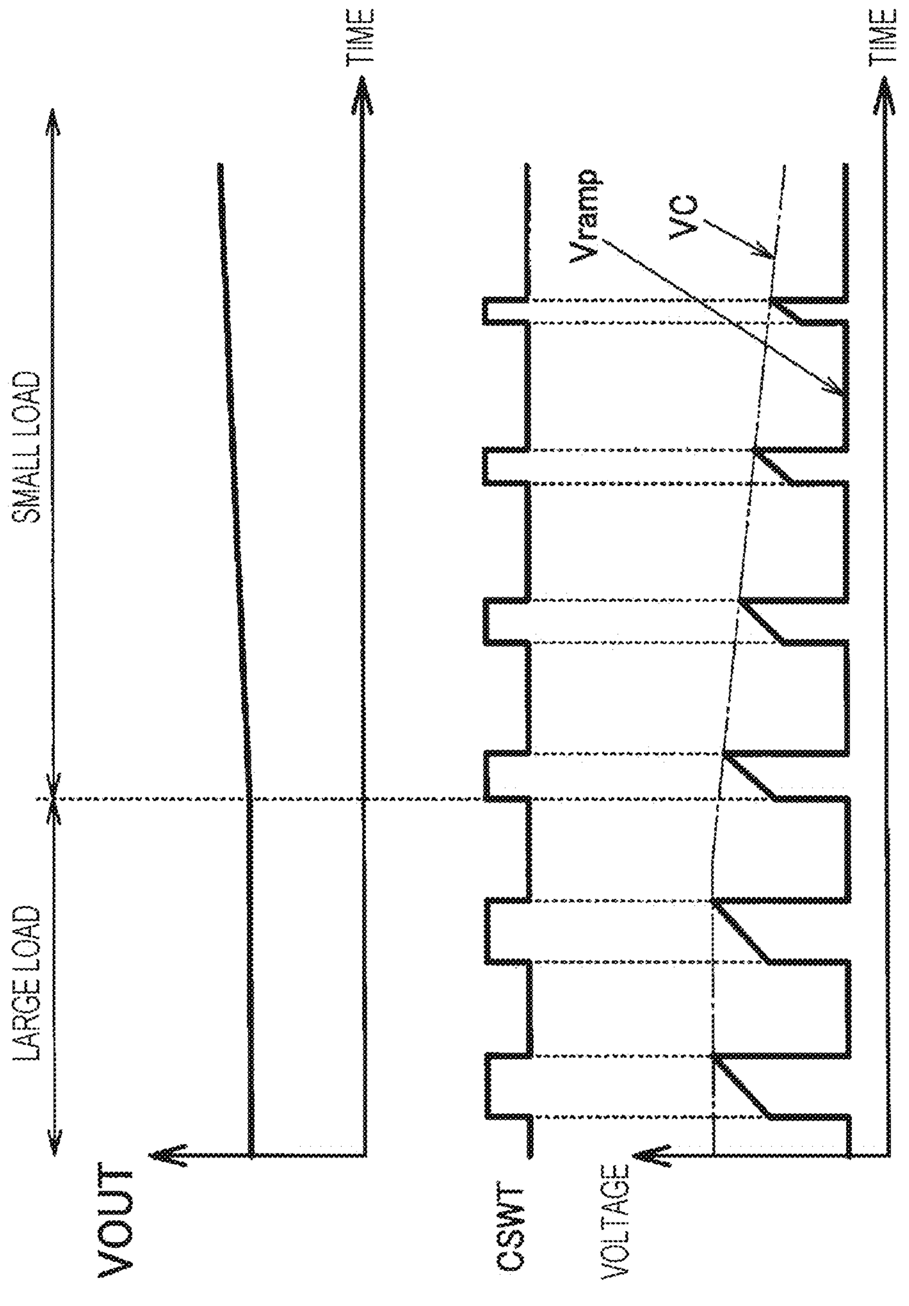
FIG. 4 illustrates an example of waveforms for explaining that a voltage output from a differential amplifier circuit decreases in PWM control.
Figure 5:
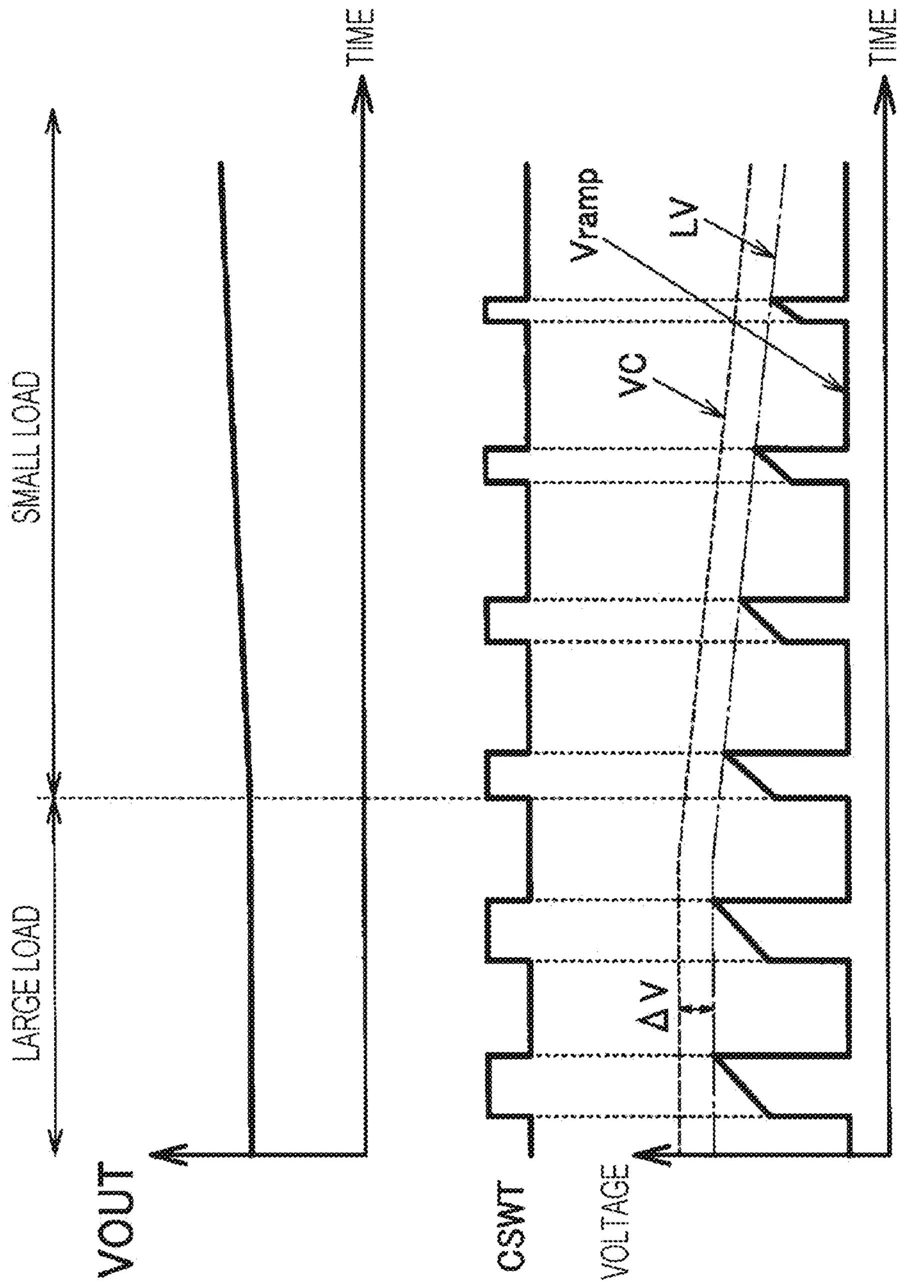
FIG. 5 illustrates an example of waveforms for explaining that a voltage output from the differential amplifier circuit decreases in PWM control.

FIGS. 4 and 5 are examples of waveforms for explaining that the voltage output from the differential amplifier circuit decreases in the PWM control. In the following description, a large load means that a current flowing through the load 290 is relatively large. In the following description, a small load means that a current flowing through the load 290 is relatively small.

FIG. 4 illustrates an example of waveforms when the level shifter 190 is not provided. When the level shifter 190 is not provided, the voltage VC output from the differential amplifier circuit 110 is input to the switching signal output circuit 130.

As illustrated in FIG. 4, when the load shifts from a state in which the load is large to a state in which the load is small, the output voltage VOUT of the switching regulator 200 tends to rise. Since the feedback control tries to keep the output voltage VOUT constant, the feedback control tries to lower the output voltage VOUT. Therefore, the voltage VC decreases, and the duty of the switching signal CSWT decreases. Specifically, since the output voltage VOUT tends to rise, the voltage DVOUT obtained by dividing the output voltage VOUT also tends to rise. The voltage DVOUT is input to the inverting input node of the differential amplifier circuit 110, and the differential amplifier circuit 110 lowers the voltage VC by comparing the voltage DVOUT with the reference voltage VREF. The switching signal output circuit 130 lowers the inductor current IL by lowering the on-duty of the switching device SWT in response to the lowering of the voltage VC. As a result, the current detection voltage Vramp based on the inductor current IL decreases as the voltage VC decreases. In this way, the feedback control is performed such that the inductor current IL decreases in a state in which the load is small, and the output voltage VOUT is kept constant.

As described above, the voltage VC at the output node NVC of the differential amplifier circuit 110 tends to decrease in a state in which the load is small. An MOS transistor included in the differential amplifier circuit 110 is assumed to operate in a saturated state. However, when the voltage VC at the output node NVC decreases, an overdrive voltage of each of the output-stage transistors coupled to the output node NVC may not be ensured, and the output-stage transistors may not operate in a saturated state. The overdrive voltage is applied between the source and the drain of the MOS transistor and is necessary for operating the MOS transistor in a saturation region. For example, as will be described later with reference to FIG. 7, when the output-stage transistors of the differential amplifier circuit 110 are cascode-coupled, it is more difficult to ensure the overdrive voltage, and there is a high possibility that the output-stage transistors may not operate in the saturated state.

When the output-stage transistors of the differential amplifier circuit 110 cannot operate in the saturated state, for example, the DC gain of the differential amplifier circuit 110 is lower than that when the output-stage transistors operate in the saturated state. Then, the DC gain of the entire feedback loop of the switching regulator 200 decreases. When the DC gain decreases, for example, the accuracy of the output voltage VOUT may decrease. For example, when the load fluctuates, the fluctuation of the output voltage VOUT may become larger than a design value.

FIG. 5 illustrates an example of waveforms in the present embodiment when the level shifter 190 is provided. In FIG. 5, an amount by which the level shifter 190 level-shifts the voltage is ΔV.

In a state in which the load is small, the level-shifted voltage LV, which is an input to the comparing circuit 133, decreases similarly to the voltage VC illustrated in FIG. 4. In this embodiment, the voltage VC before the level shifting, that is, the voltage VC output from the differential amplifier circuit 110 is higher than the level-shifted voltage LV by AV. For this reason, even when the level-shifted voltage LV decreases, it is easy to ensure the voltage VC at which the output-stage transistors of the differential amplifier circuit 110 can operate in the saturated state. For example, when an overdrive voltage of one MOS transistor is set to about 0.2 V, the overdrive voltage is at most about 0.4 V even when the output-stage transistors are cascode-coupled. Therefore, when the voltage shift amount ΔV is set to 0.4 V or higher, the output-stage transistors of the differential amplifier circuit 110 can be operated in the saturated state.

Figure 6:
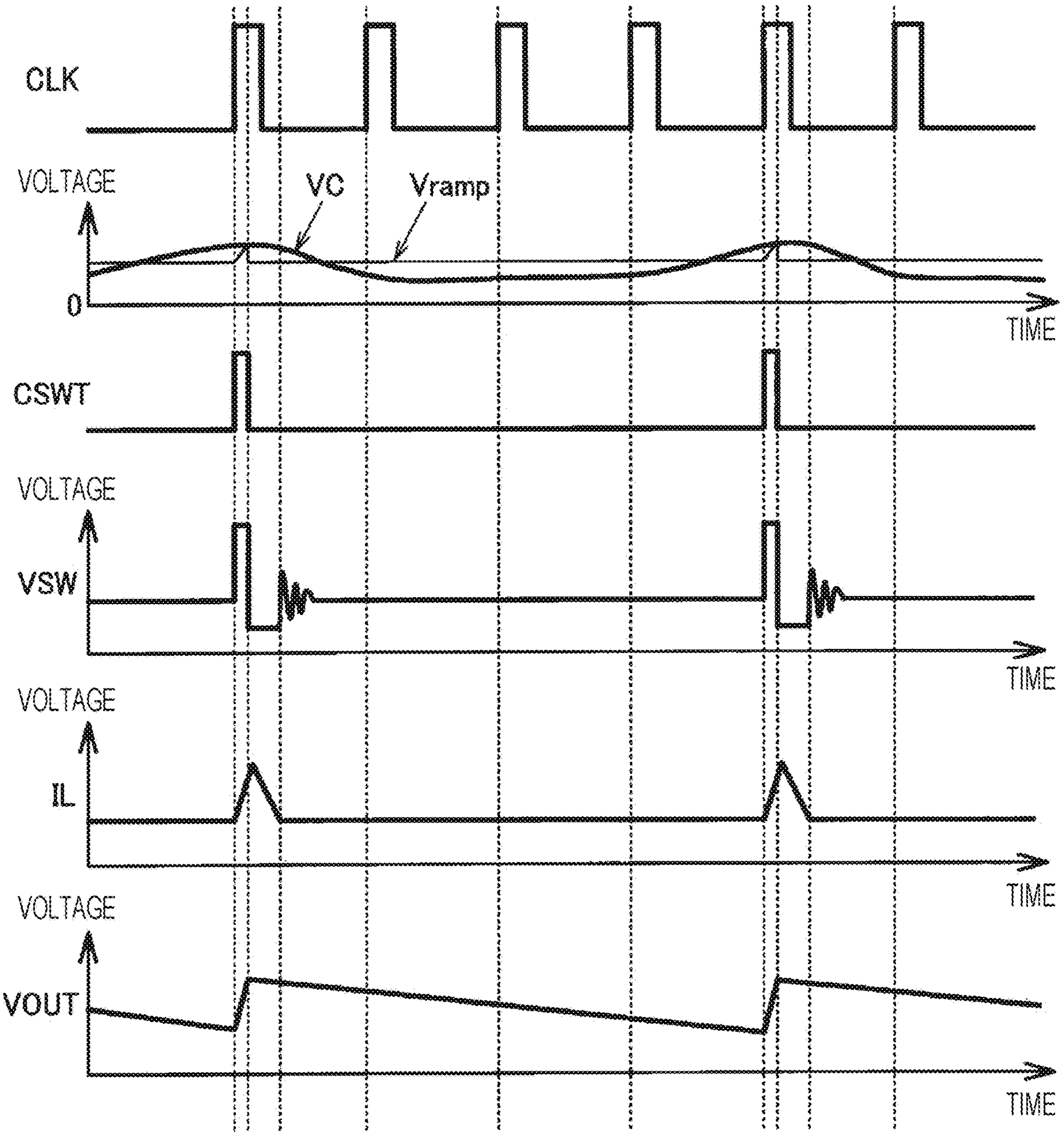
FIG. 6 illustrates an example of waveforms for explaining that a voltage output from the differential amplifier circuit decreases in PFM control.

The above-described example is the case where the PWM control is performed. However, when the load further decreases, the control shifts to the PFM control. PEM is an abbreviation for Pulse Frequency Modulation. The shift to the PFM control will be described later with reference to FIG. 9. FIG. 6 illustrates an example of waveforms for explaining that the voltage output from the differential amplifier circuit decreases in the PFM control. The example of the waveforms when the level shifter 190 is not provided will be described.

For example, a clock signal CLK is generated by an internal oscillation circuit (not illustrated). The comparing circuit 133 performs a comparison operation using a falling edge of the clock signal CLK as a comparison timing. Specifically, when Vramp<VC at the comparison timing, the comparing circuit 133 changes the switching signal CSWT from a low level to a high level to turn on the switching device SWT. When the current detection voltage Vramp reaches the voltage VC, the comparing circuit 133 changes the switching signal CSWT from the high level to the low level to turn off the switching device SWT. When the switching device SWT is turned on, the inductor current IL increases. When the switching device SWT is turned off, the inductor current IL converges. The inductor current IL charges the capacitor 220, and as a result, the output voltage VOUT increases. The differential amplifier circuit 110 lowers the voltage VC in response to the increase in the output voltage VOUT, resulting in VC<Vramp.

When the load 290 discharges the capacitor 220, the output voltage VOUT gradually decreases. However, since the load is small, the decrease in the output voltage VOUT is slow. Thus, VC<Vramp is maintained at the next comparison timing. Therefore, at the comparison timing, the comparing circuit 133 does not perform the comparison operation, and thus the switching device SWT is not turned on. Then, the switching device SWT is turned on again at the comparison timing after the output voltage VOUT decreases and Vramp<VC is established. FIG. 6 illustrates an example in which the comparison operation is performed when Vramp<VC is established at intervals of five clocks. An interval at which the switching device SWT is turned on, that is, a switching frequency varies depending on the magnitude of the load.

As described above, when the load is small and the PFM control is performed, a state in which the voltage VC is low is likely to be easily maintained. Therefore, there is a high possibility that the output-stage transistors of the differential amplifier circuit 110 may not operate in the saturated state. According to the present embodiment, since the voltage VC output by the differential amplifier circuit 110 can be increased by ΔV, the output-stage transistors of the differential amplifier circuit 110 can be operated in the saturated state even in the PFM control.

2. Differential Amplifier Circuit

Figure 7:
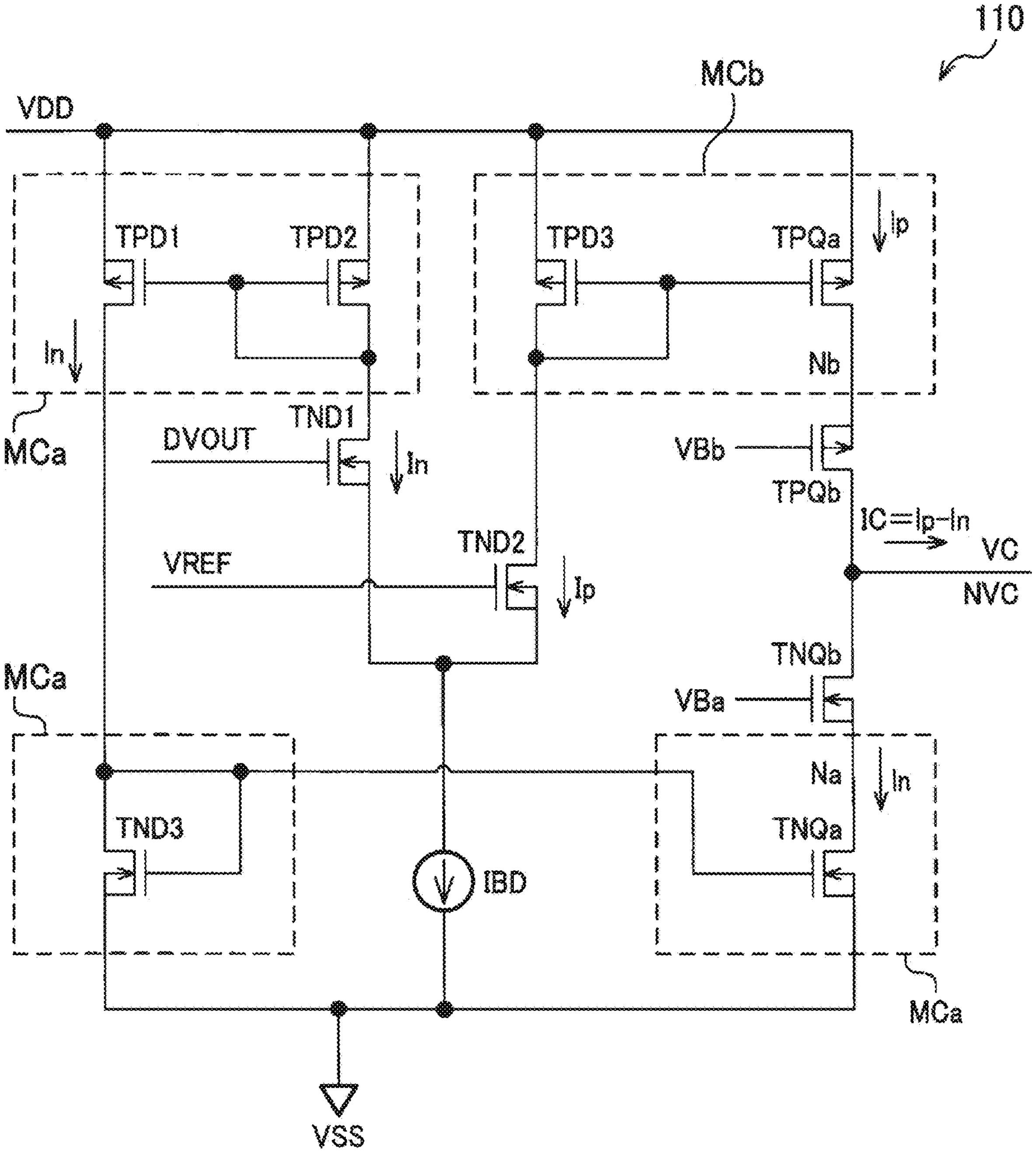
FIG. 7 illustrates an example of a detailed configuration of the differential amplifier circuit.

FIG. 7 illustrates an example of a detailed configuration of the differential amplifier circuit. Although FIG. 7 illustrates an example in which the output-stage transistors of the differential amplifier circuit 110 are cascode-coupled, the output-stage transistors may not be cascode-coupled. Hereinafter, an N-type MOS transistor is referred to as an N-type transistor, and a P-type MOS transistor is referred to as a P-type transistor.

The differential amplifier circuit 110 includes a first differential pair transistor TND1, a second differential pair transistor TND2, output-stage transistors TNQa, TNQb, TPQa, and TPQb, P-type transistors TPD1 to TPD3, an N-type transistor TND3, and a current source circuit IBD. The power supply voltage of the differential amplifier circuit 110 is the internal power supply voltage VDD generated by the regulator 170 described later with reference to FIG. 9.

The first differential pair transistor TND1 and the second differential pair transistor TND2 are N-type transistors and constitute a differential pair. The voltage DVOUT is input to the gate of the first differential pair transistor TND1, and the reference voltage VREF is input to the gate of the second differential pair transistor TND2. The current source circuit IBD supplies a current to the differential pair. A current flowing through the first differential pair transistor TND1 is represented by In, and a current flowing through the second differential pair transistor TND2 is represented by Ip.

As indicated by a broken line in FIG. 7, the differential amplifier circuit 110 includes current mirror circuits MCa and MCb. The current mirror circuit MCa mirrors the current In as a current flowing through the output-stage transistor TNQa. The current mirror circuit MCa includes the P-type transistors TPD1 and TPD2, and the N-type transistor TND3.

The current In flows through the P-type transistor TPD2. The P-type transistors TPD1 and TPD2 constitute a current mirror, and the current In flows through the P-type transistor TPD1. The current In flows through the N-type transistor TND3. The N-type transistor TND3 and the output-stage transistor TNQa constitute a current mirror, and the current In flows through the output-stage transistor TNQa.

The current mirror circuit MCb mirrors the current Ip as a current flowing through the output-stage transistor TPQa. The current mirror circuit MCb includes the P-type transistor TPD3.

The current Ip flows through the P-type transistor TPD3. The P-type transistor TPD3 and the output-stage transistor TPQa constitute a current mirror, and the current Ip flows through the output-stage transistor TPQa.

The output-stage transistors TNQa and TNQb are N-type transistors. The output-stage transistor TNQa is provided between the low-potential-side power supply node and a node Na. The output-stage transistor TNQb is provided between the node Na and the output node NVC. The coupling of the output-stage transistors TNQa and TNQb may be referred to as so-called cascode-coupling.

A bias voltage VBa is input to the gate of the output-stage transistor TNQb. For example, a voltage generating circuit (not illustrated) generates the bias voltage VBa. When a threshold voltage of each of the N-type transistors is set to Vthn, the bias voltage is $VBa=Vthn+2\times Vovn$. Vovn is an overdrive voltage of each of the N-type transistors. The overdrive voltage is applied between the source and the drain of the transistor and is necessary for operating the transistor in a saturation region. Since $VBa=Vthn+2\times Vovn$, the output-stage transistors TNQa and TNQb operate in a saturation region in a state in which $VC\geq 2\times Vovn$. For example, Vovn is about 0.2 V.

The output-stage transistors TPOa and TPQb are P-type transistors. The output-stage transistor TPQa is provided between a high-potential-side power supply node and a node Nb. The output-stage transistor TPQb is provided between the node Nb and the output node NVC. The coupling of the output-stage transistors TPQa and TPQb may be referred to as so-called cascode-coupling.

A bias voltage VBb is input to the gate of the output-stage transistor TNQb. For example, a voltage generating circuit (not illustrated) generates the bias voltage VBb. When a threshold voltage of each of the P-type transistors is Vthp, the bias voltage is $VBb=Vthp+2\times Vovp$. Vovp is an overdrive voltage of each of the P-type transistors. Since $VBb=Vthp+2\times Vovp$, the output-stage transistors TPQa and TPQb operate in a saturation region in a state in which $VC\leq VDD-2\times Vovp$. For example, Vovp is about 0.2 V.

The differential amplifier circuit 110 outputs a differential current IC=Ip−In that is the difference between the current Ip flowing through the output-stage transistors TPOa and TPQb and the current In flowing through the output-stage transistors TNQa and TNQb. The differential current IC=Ip−In is converted into the voltage VC by the output impedance RO of the differential amplifier circuit 110. That is, VC=IC×RO.

Figure 8:
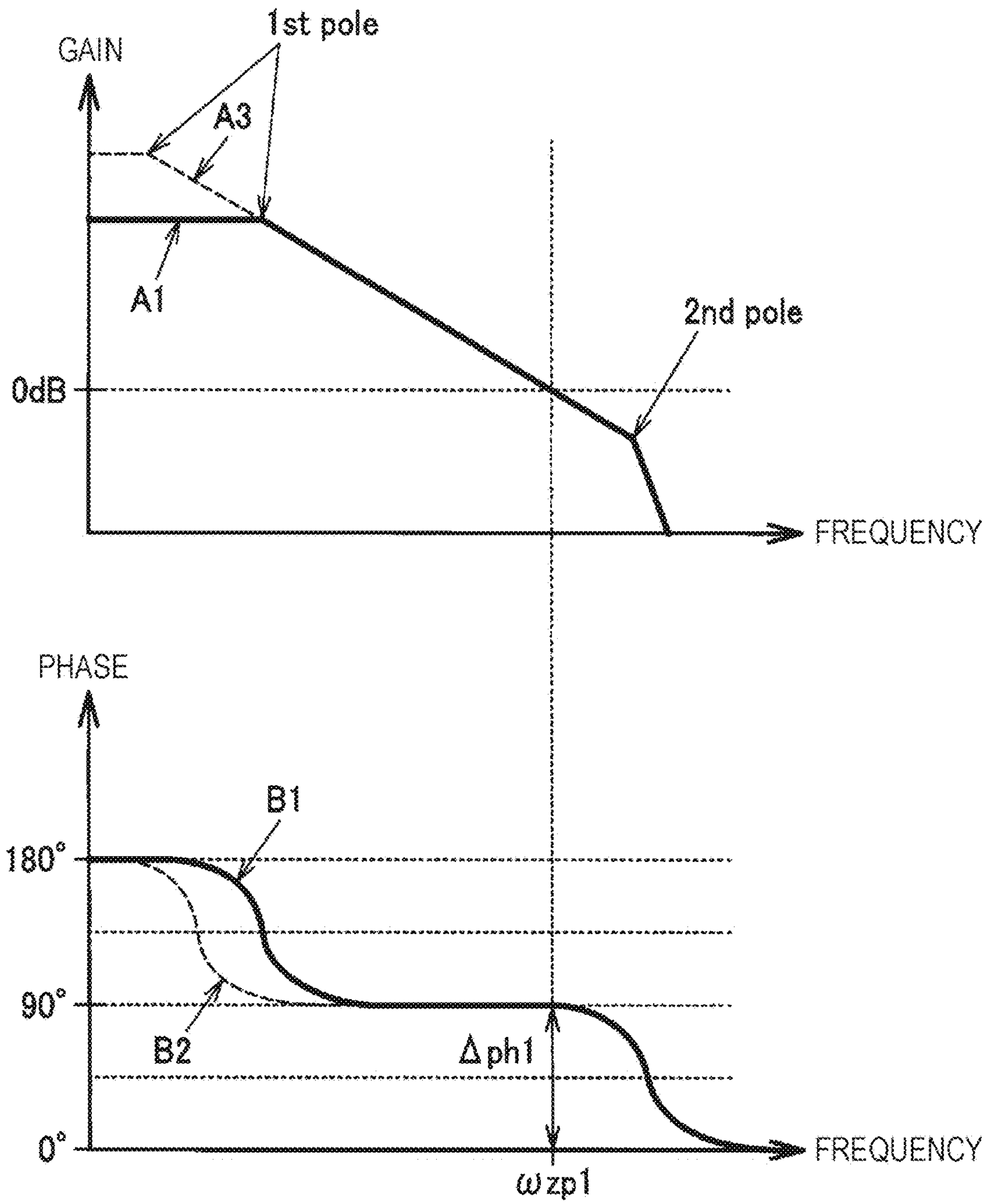
FIG. 8 illustrates an example of frequency characteristics of the switching regulator when output-stage transistors of the differential amplifier circuit are cascode-coupled.

FIG. 8 illustrates an example of frequency characteristics of the switching regulator when the output-stage transistors of the differential amplifier circuit are cascode-coupled.

Upper and lower diagrams in FIG. 8 illustrate the frequency characteristics of the transfer function of the switching regulator 200 as a whole. Lines A1 and B1 indicate the frequency-characteristics when the output-stage transistors of the differential amplifier circuit 110 are not cascode-coupled. Lines A3 and B2 indicate the frequency characteristics when the output-stage transistors of the differential amplifier circuit 110 are cascode-coupled. As described above, the transfer function of the switching regulator 200 as a whole is determined based on a transfer function of the compensator and a transfer function of the plant. Equation FC illustrated in FIG. 8 indicates the transfer function Gc(s) of the compensator out of the compensator and the plant.

As indicated by Equation FC illustrated in FIG. 8, the DC gain of the compensator is the DC gain Gm×RO of the differential amplifier circuit 110. As described with reference to FIG. 7, the output-stage transistors of the differential amplifier circuit 110 are cascode-coupled. As a result, the output impedance RO out of the DC gain Gm×RO increases. The frequency of the first pole among the frequency characteristics of the switching regulator 200 as a whole is ωpc1=1/(RO×CC1). As the output impedance RO increases, ωpc1 decreases. Therefore, as indicated by the line A3 in the upper diagram in FIG. 8, the DC gain of the transfer function Gc(s) increases due to the increase in RO, but the line A3 becomes the same as the line A1 at frequencies higher than the frequency ωpc1 of the first pole because the frequency ωpc1 of the first pole decreases. Therefore, zero-crossing frequencies of the lines A1 and A3 are the same frequency ωzp1.

As illustrated in the lower diagram in FIG. 8, even when the output impedance RO of the differential amplifier circuit 110 increases, the zero-crossing frequencies do not change, and thus a phase margin Δph1 does not change. That is, by cascode-coupling the output-stage transistors of the differential amplifier circuit 110, it is possible to increase the DC gain of the feedback loop while keeping the feedback loop stable. As a result, it is possible to improve the accuracy of the output voltage VOUT of the switching regulator while keeping the feedback loop stable.

On the other hand, since the output-stage transistors are cascode-coupled in order to increase the output impedance RO, the overdrive voltage for operating the output-stage transistors in the saturated state is high. According to the present embodiment, since the voltage VC is higher by the voltage shift amount ΔV than that when the level shifter 190 is not provided, the minimum value of the voltage VC is high, and it is possible to ensure the overdrive voltage for operating the output-stage transistors in the saturated state.

In the present embodiment, the semiconductor circuit device 100 is used for the switching regulator 200. The switching regulator 200 regulates the input voltage VH using the switching device SWT and the inductor 210. The semiconductor circuit device 100 includes the current detecting circuit 134, the differential amplifier circuit 110, the level shifter 190, and the comparing circuit 133. The current detecting circuit 134 converts the inductor current IL flowing through the inductor 210 into a voltage and outputs the voltage as the current detection voltage Vramp. The differential amplifier circuit 110 includes the MOS transistor provided between the power supply node and the output node NVC. The differential amplifier circuit 110 amplifies the difference between the voltage DVOUT corresponding to the output voltage VOUT and the reference voltage VREF. The level shifter 190 level-shifts the voltage VC at the output node NVC of the differential amplifier circuit 110 to a low potential side and outputs the level-shifted voltage LV. The comparing circuit 133 compares the current detection voltage Vramp with the level-shifted voltage LV and outputs a switching signal CSWT for the switching device SWT.

As described with reference to FIG. 4 or 6, when, for example, the load is small, the voltage VC output from the differential amplifier circuit 110 may decrease, and the MOS transistor coupled to the output node NVC of the differential amplifier circuit 110 may not operate in the saturated state. According to the present embodiment, by providing the level shifter 190, the voltage VC can be increased by the amount ΔV by which the voltage is level-shifted. Accordingly, since the MOS transistor coupled to the output node NVC of the differential amplifier circuit 110 can operate in the saturated state, the characteristics of the switching regulator 200 do not degrade. For example, when the MOS transistor does not operate in the saturated state, the DC gain of the feedback loop decreases, and the accuracy of the output voltage VOUT decreases. According to the present embodiment, since the MOS transistor operates in the saturated state, the DC gain of the feedback loop does not decrease, and the accuracy of the output voltage VOUT can be maintained.

Further, in the present embodiment, the level shifter 190 may be a source follower circuit.

Specifically, the level shifter 190 may include the N-type MOS transistor TNL and the resistor RL or the current source IBL. The voltage VC at the output node NVC of the differential amplifier circuit 110 may be input to the gate of the N-type MOS transistor TNL. The N-type MOS transistor TNL may output the level-shifted voltage LV from the source of the N-type MOS transistor TNL. The resistor RL or the current source IBL may be provided between the source of the N-type MOS transistor TNL and the low-potential-side power supply node.

According to the present embodiment, the amount ΔV by which the voltage is level-shifted is about the threshold voltage of the N-type MOS transistor TNL. Since the minimum value of the voltage VC output from the differential amplifier circuit 110 is equal to or greater than AV, the minimum value of the voltage VC is equal to or greater than the threshold voltage of the N-type MOS transistor TNL. Since it is assumed that the overdrive voltage of the MOS transistor coupled to the output node NVC of the differential amplifier circuit 110 is lower than the threshold voltage of the N-type MOS transistor TNL, the MOS transistor coupled to the output node NVC of the differential amplifier circuit 110 can be operated in the saturated state.

Further, in the present embodiment, the amount ΔV by which the level shifter 190 level-shifts the voltage may be equal to or greater than the overdrive voltage when the transistors included in the output stage of the differential amplifier circuit 110 operate in the saturated state.

According to the present embodiment, since the voltage VC output from the differential amplifier circuit 110 is higher than the level-shifted voltage LV by the voltage shift amount ΔV, the voltage VC becomes equal to or higher than the overdrive voltage. Accordingly, the transistors included in the output stage of the differential amplifier circuit 110 can operate in the saturated state.

Further, in the present embodiment, the gain of the level shifter 190 may be smaller than the gain of the plant including the switching device SWT, the inductor 210, the current detecting circuit 134, and the comparing circuit 133. In addition, the gain of the level shifter 190 may be smaller than the gain of the compensator including the differential amplifier circuit 110. In addition, the gain of the level shifter 190 may be smaller than the product of the gain of the plant and the gain of the compensator.

The plant and the compensator do not include the level shifter 190. That is, the gain of the feedback loop of the switching regulator 200 is the product of the gain of the plant, the gain of the compensator, and the gain of the level shifter 190. In this case, when the gain of the level shifter 190 is large, the zero-crossing frequencies at which the gain is 0 dB are high, and thus the phase margin may be small, and the feedback loop may become unstable. According to the present embodiment, since the gain of the level shifter 190 is relatively smaller than the gain of the plant and the like, the phase margin can be easily ensured.

In the present embodiment, the gain of the level shifter 190 may be 0 dB.

According to the present embodiment, the gain of the level shifter 190 does not affect the gain of the feedback loop of the switching regulator 200. Therefore, even when the level shifter 190 is provided, the zero-crossing frequencies do not change and the stability of the feedback loop does not decrease.

In the present embodiment, the differential amplifier circuit 110 may include a first output-stage transistor and a second output-stage transistor. The first output-stage transistor is provided between a first power supply node and a first node and outputs a current. The second output-stage transistor is provided between the first node and the output node and has a gate to which a first bias voltage is input.

As described with reference to FIG. 8 and the like, since the output impedance RO of the differential amplifier circuit 110 increases, it is possible to achieve the accuracy of the output voltage VOUT and the stability of the feedback loop. Meanwhile, since the output-stage transistors of the differential amplifier circuit 110 are cascode-coupled in order to increase the output impedance RO, the overdrive voltage for operating the output-stage transistors in the saturated state is high. According to the present embodiment, since the voltage VC output from the differential amplifier circuit 110 is increased by the voltage shift amount ΔV, it is easy to ensure the overdrive voltage.

The first output-stage transistor may be either the transistor TNQa or the transistor TPQa illustrated in FIG. 7. When the transistor TNQa is the first output-stage transistor, the transistor TNQb is the second output-stage transistor, the low-potential-side power supply node is the first power supply node, the node Na is the first node, and the bias voltage VBa is the first bias voltage. When the transistor TPQa is the first output-stage transistor, the transistor TPQb is the second output-stage transistor, the high-potential-side power supply node is the first power supply node, the node Nb is the first node, and the bias voltage VBb is the first bias voltage.

In this embodiment, the first power supply node may be the low-potential-side power supply node. The amount ΔV by which the level shifter 190 level-shifts the voltage may be equal to or higher than an overdrive voltage when the first output-stage transistor and the second output-stage transistor operate in a saturated state.

According to the present embodiment, even when the voltage VC output by the differential amplifier circuit 110 becomes low, the voltage VC is equal to or greater than the voltage shift amount ΔV. Therefore, the overdrive voltage when the first output-stage transistor and the second output-stage transistor operate in the saturated state is ensured.

In this case, the first output-stage transistor is the transistor TNQa illustrated in FIG. 7, and the second output-stage transistor is the transistor TNQb illustrated in FIG. 7.

Further, in the present embodiment, the differential amplifier circuit 110 may include the first differential pair transistor TND1, the second differential pair transistor TND2, and a first current mirror circuit. The voltage DVOUT based on the output voltage VOUT output from the switching regulator 200 may be input to the gate of the first differential pair transistor TND1. The reference voltage VREF may be input to the gate of the second differential pair transistor TND2. The first current mirror circuit may mirror a current flowing through one of the first differential pair transistor TND1 and the second differential pair transistor TND2 as a current flowing through the first output-stage transistor.

In the present embodiment, the differential amplifier circuit 110 may include a third output-stage transistor, a fourth output-stage transistor, and a second current mirror circuit. The third output-stage transistor may be provided between a second node and a second power supply node at a potential different from a potential of the first power supply node and may output a current. The fourth output-stage transistor may be provided between the second node and the output node and have a gate to which a second bias voltage is input. The second current mirror circuit may mirror a current flowing through the other of the first differential pair transistor TND1 and the second differential pair transistor TND2 as a current flowing through the third output-stage transistor.

According to the present embodiment, a current flows through the differential pair transistors in accordance with a voltage input to the gates of the differential pair transistors, and the current is mirrored to the output-stage transistors. Thus, the differential amplifier circuit 110 outputs a current corresponding to the input voltage. That is, the differential amplifier circuit 110 functions as a transconductance amplifier. According to the present embodiment, the output-stage transistors are cascode-coupled on both the first power supply node side and the second power supply node side. The differential amplifier circuit 110 outputs the difference between a current flowing through the output-stage transistors on the first power supply node side and a current flowing through the output-stage transistors on the second power supply node side. In the present embodiment, since the impedance increases with respect to the current on each of the power supply node sides, the output impedance RO of the differential amplifier circuit 110 increases.

When the transistor TNQa is the first output-stage transistor, the transistor TNQb is the second output-stage transistor, the transistor TPQa is the third output-stage transistor, the transistor TPQb is the fourth output-stage transistor, the current mirror circuit MCa is the first current mirror circuit, and the current mirror circuit MCb is the second current mirror circuit. When the transistor TPQa is the first output-stage transistor, the transistor TPQb is the second output-stage transistor, the transistor TNQa is the third output-stage transistor, the transistor TNQb is the fourth output-stage transistor, the current mirror circuit MCb is the first current mirror circuit, and the current mirror circuit MCa is the second current mirror circuit.

3. Switching Signal Output Circuit

Figure 9:
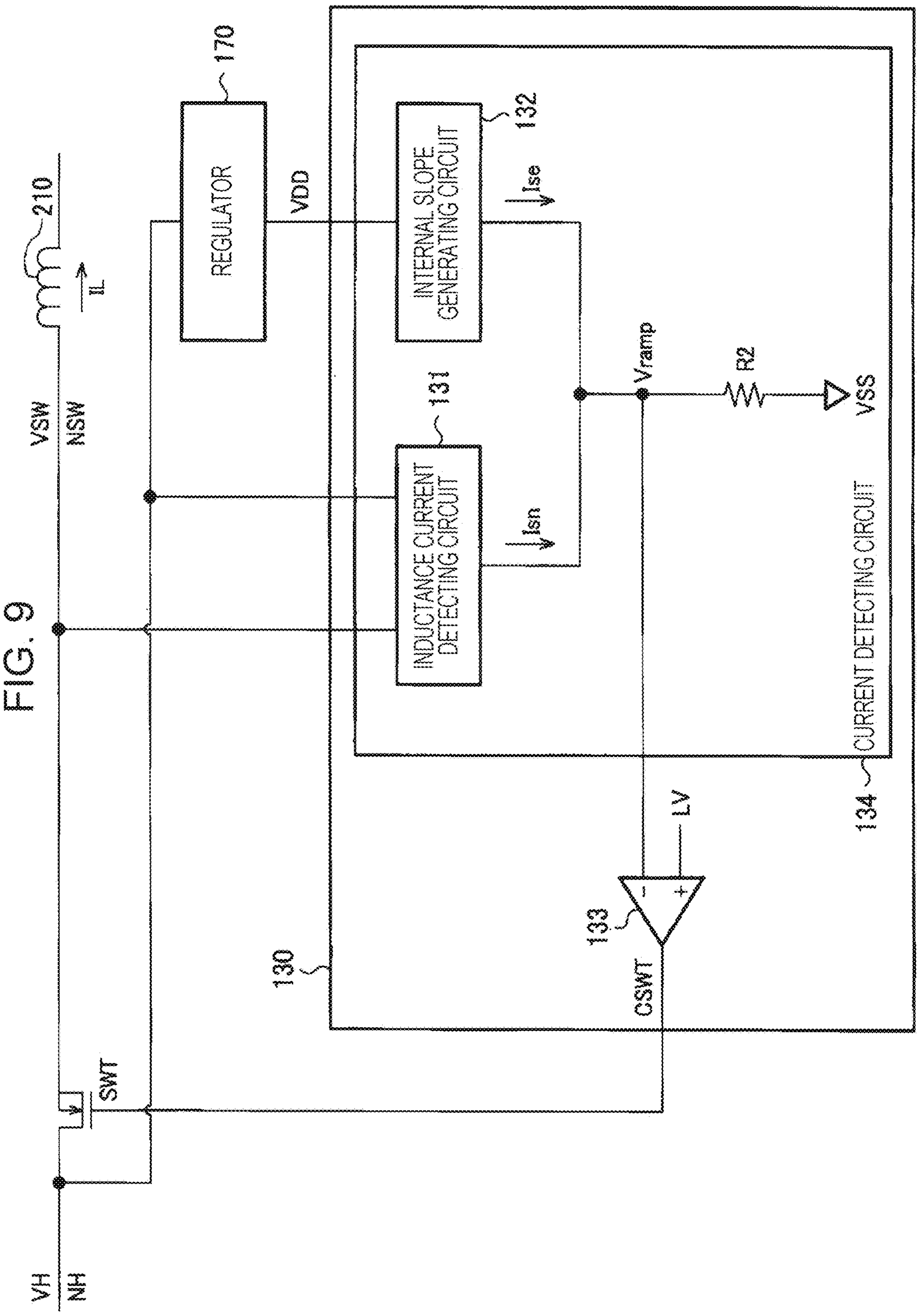
FIG. 9 illustrates an example of a detailed configuration of a switching signal output circuit.

FIG. 9 illustrates an example of a detailed configuration of the switching signal output circuit. The semiconductor circuit device 100 includes the regulator 170. The switching signal output circuit 130 includes the current detecting circuit 134 and the comparing circuit 133. The current detecting circuit 134 includes an inductance current detecting circuit 131, an internal slope generating circuit 132, and a resistor R2.

The regulator 170 is a DC/DC converter that regulates the input voltage VH to the internal power supply voltage VDD. The regulator 170 is, for example, a linear regulator including an operational amplifier and a resistor, but is not limited thereto.

The inductance current detecting circuit 131 detects the inductor current IL based on the difference between the input voltage VH and the voltage VSW at the switching node NSW and outputs the result of the detection as a detected current Isn.

The internal slope generating circuit 132 operates with the internal power supply voltage VDD and generates a slope current Ise having a predetermined slope.

One end of the resistor R2 is coupled to an output node of the inductance current detecting circuit 131, an output node of the internal slope generating circuit 132, and an inverting input node of the comparing circuit 133. The other end of the resistor R2 is coupled to the low-potential-side power supply node. The resistor R2 converts the detected current Isn and the slope current Ise into the voltage Vramp.

The voltage LV is input from the level shifter 190 to a non-inverting input terminal of the comparing circuit 133. The comparing circuit 133 compares the voltage Vramp with the voltage LV and generates a switching signal CSWT which is a PWM signal or a PFM signal.

Figure 10:
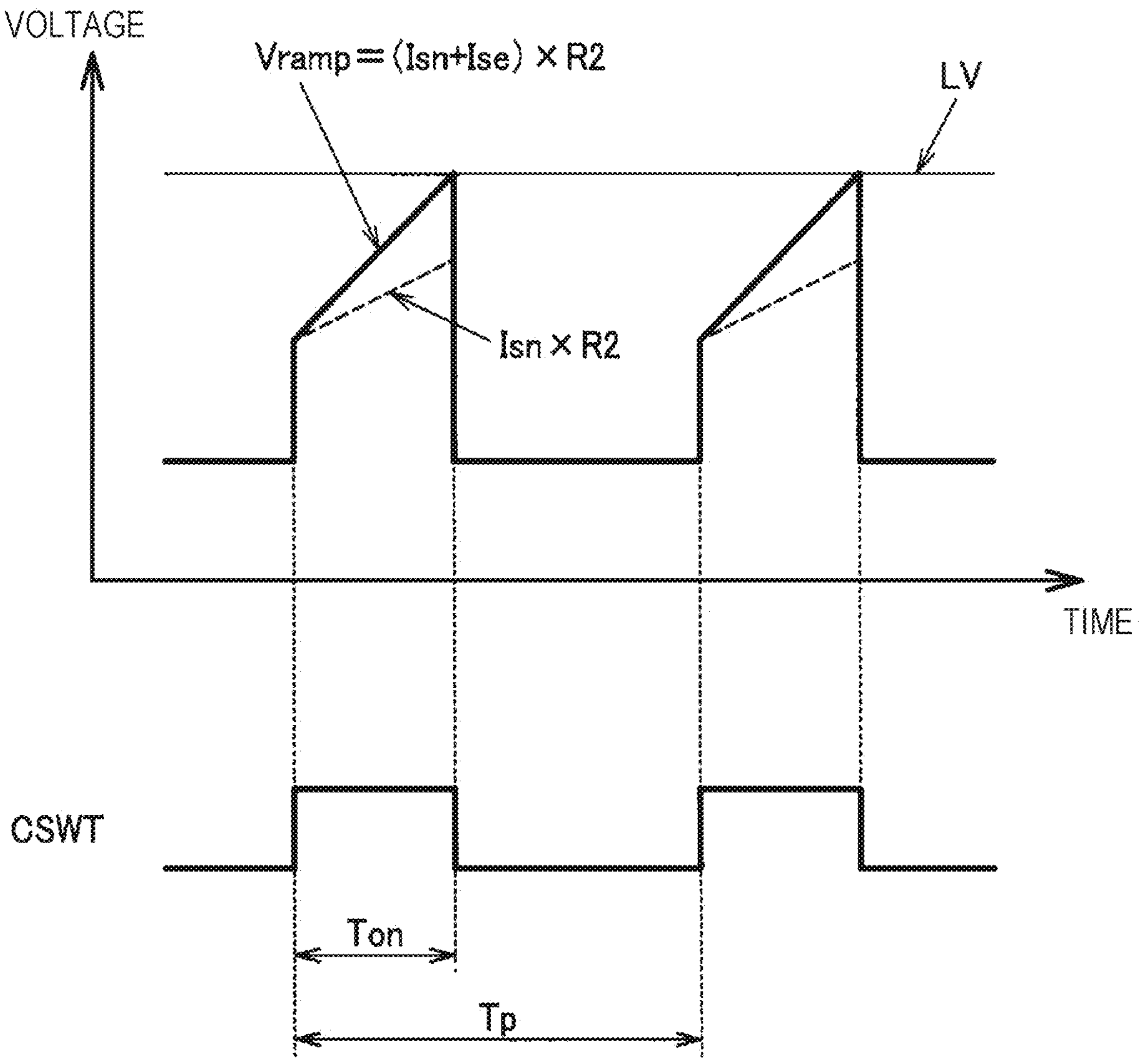
FIG. 10 illustrates an example of a waveform of a signal of the switching signal output circuit.

FIG. 10 illustrates an example of a waveform of the signal of the switching signal output circuit.

The comparing circuit 133 performs the comparison operation when the voltage Vramp is lower than the voltage LV at a comparison timing in each period Tp, and does not perform the comparison operation when the voltage Vramp is equal to or higher than the voltage LV at the comparison timing in each period Tp. That is, when the voltage Vramp is lower than the voltage LV at each comparison timing, the comparing circuit 133 resets the switching signal CSWT to a high level. When the switching signal CSWT is reset to the high level, the switching device SWT is switched from off to on, and the detected current Isn and the slope current Ise are output. In this case, Vramp=(Isn+Ise)×R2. When the voltage Vramp reaches the voltage LV, the comparing circuit 133 changes the switching signal CSWT from the high level to the low level. As a result, the switching device SWT is switched from on to off. When the switching device SWT is turned off, the detected current Isn and the slope current Ise are not output. Each comparison timing is determined based on, for example, a clock signal generated by the internal oscillation circuit (not illustrated). However, each comparison timing may be determined based on a clock signal supplied from the outside of the semiconductor circuit device 100, or may be determined using a counter or the like.

Although FIG. 10 illustrates the voltage LV as a constant voltage, the voltage LV is actually affected by the output voltage VOUT. When the load of the switching regulator 200 is large, the output voltage VOUT quickly decreases after the switching device SWT is turned off. Thus, the voltage LV is maintained at a relatively high voltage, and the time required to return to Vramp<LV is shorter than the period Tp. Therefore, at each comparison timing, Vramp<LV is established and the comparison operation is performed. In this case, the control of the switching device SWT is the PWM control.

On the other hand, when the load of the switching regulator 200 is small, it takes time for the output voltage VOUT to drop after the switching device SWT is turned off, the voltage LV becomes relatively low, and the time required to return to Vramp<LV is longer than the period Tp. Therefore, after the switching device SWT is turned on and off, Vramp<LV is established after one or more periods Tp, and the comparison operation is performed. In this case, the control of the switching device SWT is the PFM control.

FIG. 10 illustrates an example of the PWM control. As described above, the voltage LV fluctuates in a short time period, but the voltage LV as an average for a long time period is controlled such that the voltage DVOUT obtained by dividing the output voltage VOUT matches the reference voltage VREF. When the voltage LV changes, a time period Ton for which the switching device SWT is on changes, the on-duty of the switching signal CSWT, which is a PWM signal, changes, and the output voltage VOUT changes. In this way, the feedback control is performed such that the output voltage VOUT as the average for the long time period is kept constant.

Figure 11:
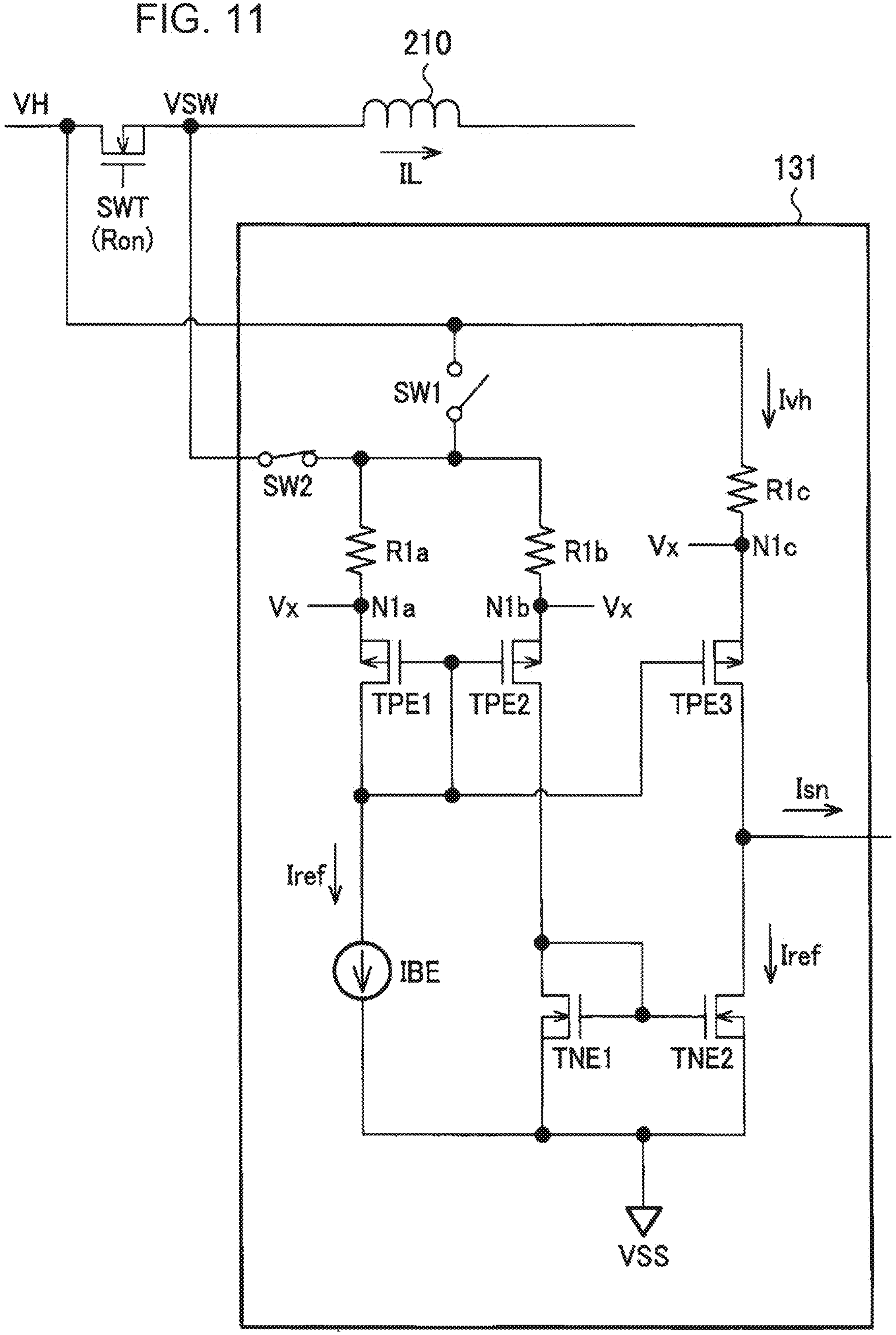
FIG. 11 illustrates an example of a detailed configuration of an inductance current detecting circuit.

FIG. 11 illustrates an example of a detailed configuration of the inductance current detecting circuit. The inductance current detecting circuit 131 includes switches SW1 and SW2, resistors R1*a*, R1*b*, and Ric, P-type transistors TPE1, TPE2, and TPE3, N-type transistors TNE1 and TNE2, and a current source circuit IBE. An operation of the inductance current detecting circuit 131 is described below using an example of signal waveforms.

Figure 12:
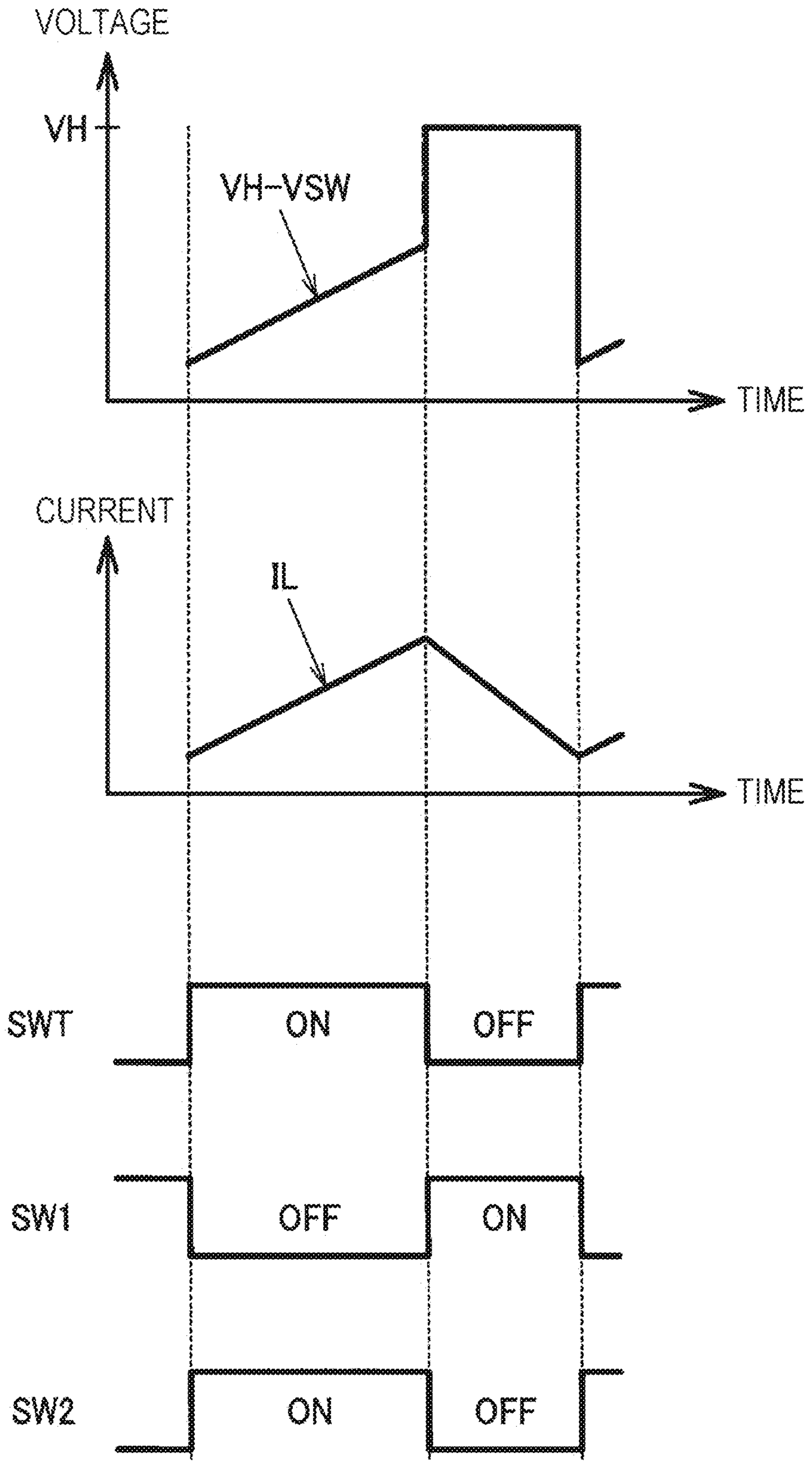
FIG. 12 illustrates an example of waveforms of signals of the inductance current detecting circuit.

FIG. 12 illustrates an example of waveforms of signals of the inductance current detecting circuit. The on-resistance of the switching device SWT is represented by Ron. It is assumed that resistance values of the resistors R1*a*, R1*b*, and R1*c* are equal and are R1.

As illustrated in FIG. 12, when the switching device SWT is on, the switch SW1 is off and the switch SW2 is on. The inductor current IL gradually increases. The inductor current IL is converted into the difference in potential expressed in Equation (1) below by the on-resistance Ron. The inductance current detecting circuit 131 generates the detected current Isn from the difference VH-VSW in potential.

$$VH - VSW = IL \times Ron \tag{1}$$

Specifically, the current source circuit IBE causes a current Iref to flow through the resistor R1*a* and the P-type transistor TPE1. A voltage at a node N1*a* between the resistor R1*a* and the P-type transistor TPE1 is represented by Vx. Since the difference in potential between both ends of the resistor R1*a* is VSW-Vx, the current Iref is expressed by Equation (2) below.

$$Iref = (VSW - Vx)/R1 \tag{2}$$

The P-type transistors TPE1 and TPE2 constitute a current mirror, and the current Iref flows through the resistor R1*b* and the P-type transistor TPE2. The P-type transistors TPE1 and TPE3 constitute a current mirror, and the current Iref flows through the resistor R1*c* and the P-type transistor TPE3. As a result, a voltage at a node N1*b* between the resistor R1*b* and the P-type transistor TPE2 and a voltage at a node N1*c* between the resistor R1*c* and the P-type transistor TPE3 become equal to Vx.

Since the difference in potential between both ends of the resistor R1*c* is VH-Vx, a current Ivh flowing through the resistor R1*c* and the P-type transistor TPE3 is expressed by Equation (3) below.

$$Ivh=(VH-Vx)/R1 \tag{3}$$

The current Iref flowing through the P-type transistor TPE2 flows through the N-type transistor TNE1. The N-type transistors TNE1 and TNE2 constitute a current mirror, and the current Iref flows through the N-type transistor TNE2. The inductance current detecting circuit 131 outputs the difference between the current IVh flowing through the P-type transistor TPE3 and the current Iref flowing through the N-type transistor TNE2 as the detected current Isn. Based on Equations (1) to (3) above, the detected current Isn is expressed by Expression (4) below.

$$Isn=Ivh-Iref=(VH-VSW)/R1=IL\times Ron/R1 \tag{4}$$

When the switching device SWT is off, the switch SW1 is on and the switch SW2 is off. The inductor current IL gradually decreases. Since the switch SW1 is on, Iref=Ivh and Isn=0.

Figure 13:
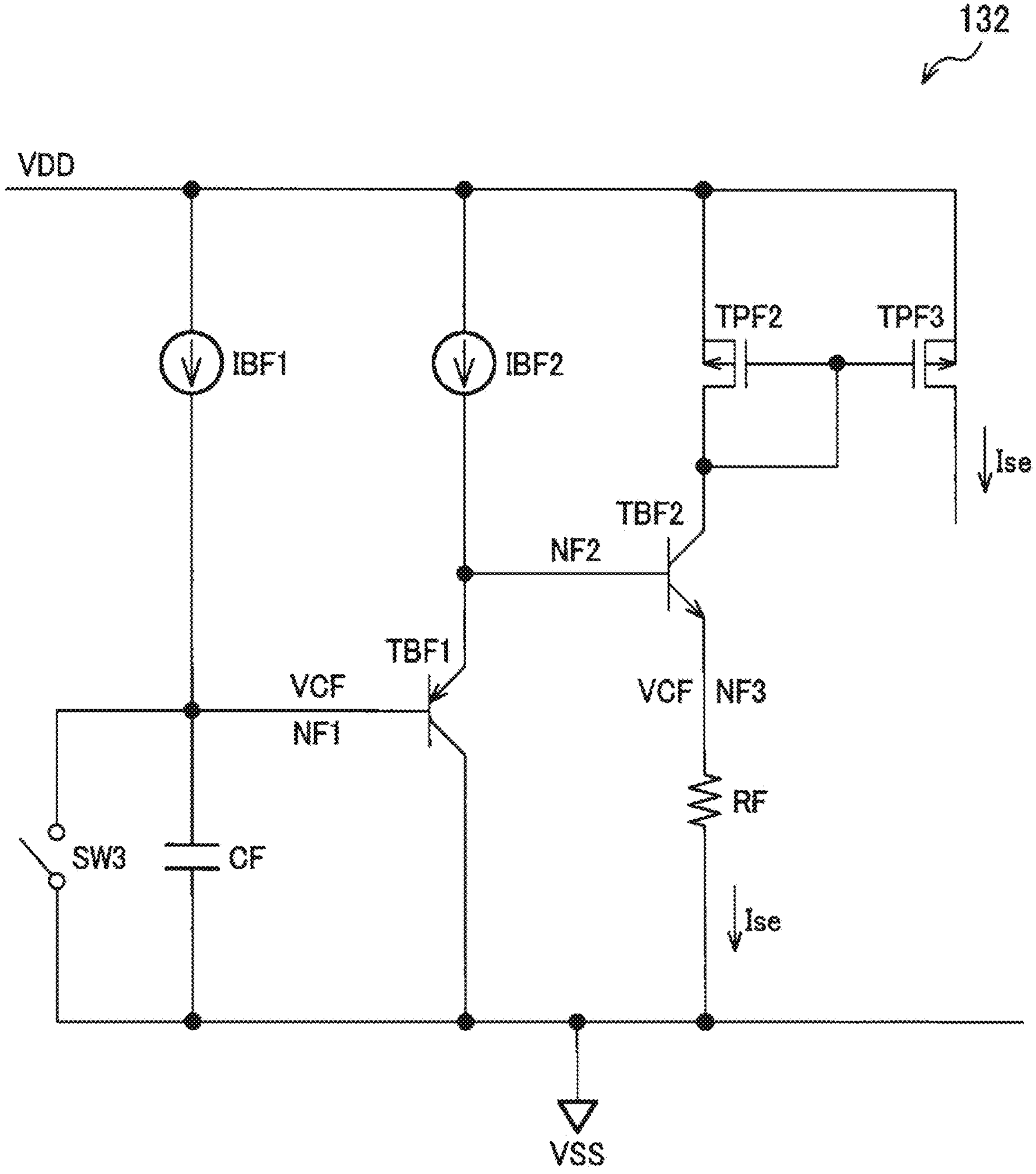
FIG. 13 illustrates an example of a detailed configuration of a slope generating circuit.

FIG. 13 illustrates an example of a detailed configuration of a slope generating circuit. The internal slope generating circuit 132 includes current source circuits IBF1 and IBF2, a PNP transistor TBF1, an NPN transistor TBF2, P-type transistors TPF2 and TPF3, a switch SW3, a capacitor CF, and a resistor RF. An operation of the internal slope generating circuit 132 will be described below.

When the switching device SWT is on, the switch SW3 is off. When the current source circuit IBF1 causes a current to flow through a node NF1 at one end of the capacitor CF, a voltage VCF at the node NF1 increases at a predetermined rate.

The base of the PNP transistor TBF1 is coupled to the node NF1. It is assumed that a voltage between the base and the emitter of the bipolar transistor is Vbe. In this case, a voltage at a node NF2 of the emitter of the PNP transistor TBF1 is VCF+Vbe. The base of the NPN transistor TBF2 is coupled to the node NF2. A voltage at a node NF3 of the emitter of the NPN transistor is (VCF+Vbe)−Vbe=VCF.

The resistor RF is provided between the node NF3 and the low-potential-side power supply node. When the voltage of the low-potential-side power supply VSS is 0 V, a current VCF/RF flows through the resistor RF. This current VCF/RF flows through the P-type transistor TPF2 and the NPN transistor TBF2. The P-type transistors TPF2 and TPF3 constitute a current mirror, and the current VCF/RF flows through the P-type transistor TPF3. The internal slope generating circuit 132 outputs, as the slope current Ise, a current flowing through the P-type transistor TPF3. That is, the slope current Ise is expressed by Equation (5) below.

$$Ise=VCF/RF\ldots \tag{5}$$

When the switching device SWT is off, the switch SW3 is on. Since both ends of the capacitor CF are short-circuited by the switch SW3, the voltage VCF becomes 0 V. Therefore, Ise=0.

Although the present embodiment is described above, those skilled in the art will readily appreciate that many modifications can be made without materially departing from the features and effects of the present disclosure. Therefore, all such modifications are included in the scope of the present disclosure. For example, a term described together with a different term having a broader meaning or the same meaning at least once in the specification or the drawings can be replaced with the different term in any place in the specification or the drawings. In addition, all combinations of the embodiment and the modifications are also included in the scope of the present disclosure. The configurations, the operations, and the like of the differential amplifier circuit, the phase compensation circuit, the switching signal output circuit, the semiconductor circuit device, the switching regulator, and the like are not limited to those described in the present embodiment and can be variously modified.

What is claimed is:

1. A semiconductor circuit device that is used for a switching regulator that regulates an input voltage using a switching device and an inductor and outputs an output voltage, the semiconductor circuit device comprising:

a current detecting circuit that converts an inductor current flowing through the inductor into a voltage and outputs the voltage as a current detection voltage;

a differential amplifier circuit that includes a MOS transistor provided between a power supply node and an output node and amplifies a difference between a voltage corresponding to the output voltage and a reference voltage;

a level shifter that level-shifts a voltage at the output node of the differential amplifier circuit to a low potential side and outputs a level-shifted voltage; and a comparing circuit that compares the current detection voltage with the level-shifted voltage and outputs a switching signal for the switching device, wherein an amount by which the level shifter level-shifts the voltage at the output node of the differential amplifier circuit is equal to or greater than an overdrive voltage when a transistor included in an output stage of the differential amplifier circuit operates in a saturated state.

2. The semiconductor circuit device according to claim 1, wherein the level shifter is a source follower circuit.

3. The semiconductor circuit device according to claim 2, wherein the source follower circuit includes an N-type MOS transistor having a gate to which the voltage at the output node of the differential amplifier circuit is input, and a source from which the level-shifted voltage is output, and a resistor or a current source provided between the source and a low-potential-side power supply node.

4. The semiconductor circuit device according to claim 1, wherein a gain of the level shifter is smaller than a gain of a plant including the switching device, the inductor, the current detecting circuit, and the comparing circuit, smaller than a gain of a compensator including the differential amplifier circuit, and smaller than a product of the gain of the plant and the gain of the compensator.

5. The semiconductor circuit device according to claim 1, wherein a gain of the level shifter is 0 dB.

6. The semiconductor circuit device according to claim 1, wherein the differential amplifier circuit includes a first output-stage transistor that is provided between a first power supply node and a first node and outputs a current, and a second output-stage transistor that is provided between the first node and the output node and has a gate to which a first bias voltage is input.

7. The semiconductor circuit device according to claim 6, wherein the first power supply node is a low-potential-side power supply node, and an amount by which the level shifter level-shifts the voltage at the output node of the differential amplifier circuit is equal to or greater than an overdrive voltage when the first output-stage transistor and the second output-stage transistor operate in a saturated state.

8. The semiconductor circuit device according to claim 7, wherein the differential amplifier circuit includes a first differential pair transistor having a gate to which a voltage based on the output voltage of the switching regulator is input, a second differential pair transistor having a gate to which the reference voltage is input, and a first current mirror circuit that mirrors a current flowing through one of the first differential pair transistor and the second differential pair transistor as a current flowing through the first output-stage transistor.

9. The semiconductor circuit device according to claim 8, wherein the differential amplifier circuit includes a third output-stage transistor that is provided between a second node and a second power supply node at a potential different from a potential of the first power supply node and outputs a current, a fourth output-stage transistor that is provided between the second node and the output node of the differential amplifier circuit and has a gate to which a second bias voltage is input, and a second current mirror circuit that mirrors a current flowing through the other of the first differential pair transistor and the second differential pair transistor as a current flowing through the third output-stage transistor.

10. The semiconductor circuit device according to claim 1, further comprising a phase compensation circuit coupled to the output node of the differential amplifier circuit, wherein the phase compensation circuit includes a resistor and a first capacitor that are coupled in series between the output node of the differential amplifier circuit and a low-potential-side power supply node.

11. A switching regulator comprising:

the semiconductor circuit device according to claim 1; and the inductor.

12. A semiconductor circuit device that is used for a switching regulator that regulates an input voltage using a switching device and an inductor and outputs an output voltage, the semiconductor circuit device comprising:

a current detecting circuit that converts an inductor current flowing through the inductor into a voltage and outputs the voltage as a current detection voltage;

a differential amplifier circuit that includes a MOS transistor provided between a power supply node and an output node and amplifies a difference between a voltage corresponding to the output voltage and a reference voltage;

a level shifter that level-shifts a voltage at the output node of the differential amplifier circuit to a low potential side and outputs a level-shifted voltage; and a comparing circuit that compares the current detection voltage with the level-shifted voltage and outputs a switching signal for the switching device, wherein the differential amplifier circuit includes a first output-stage transistor that is provided between a first power supply node and a first node and outputs a current, and a second output-stage transistor that is provided between the first node and the output node and has a gate to which a first bias voltage is input, wherein the first power supply node is a low-potential-side power supply node, and an amount by which the level shifter level-shifts the voltage at the output node of the differential amplifier circuit is equal to or greater than an overdrive voltage when the first output-stage transistor and the second output-stage transistor operate in a saturated state.

13. The semiconductor circuit device according to claim 12, wherein the differential amplifier circuit includes a first differential pair transistor having a gate to which a voltage based on the output voltage of the switching regulator is input, a second differential pair transistor having a gate to which the reference voltage is input, and a first current mirror circuit that mirrors a current flowing through one of the first differential pair transistor and the second differential pair transistor as a current flowing through the first output-stage transistor.

14. The semiconductor circuit device according to claim 13, wherein the differential amplifier circuit includes a third output-stage transistor that is provided between a second node and a second power supply node at a potential different from a potential of the first power supply node and outputs a current, a fourth output-stage transistor that is provided between the second node and the output node of the differential amplifier circuit and has a gate to which a second bias voltage is input, and a second current mirror circuit that mirrors a current flowing through the other of the first differential pair transistor and the second differential pair transistor as a current flowing through the third output-stage transistor.

* * * * *